(12) United States Patent
Mito et al.

(10) Patent No.: US 7,247,864 B2
(45) Date of Patent: Jul. 24, 2007

(54) CHARGED PARTICLE BEAM APPARATUS

(75) Inventors: Hiroaki Mito, Hitachinaka (JP);
Katsuhiro Sasada, Hitachinaka (JP);
Kazuo Kato, Naka (JP); Tomohiro Kudo, Hitachinaka (JP); Tomonori Saeki, Yokosuka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/305,109

(22) Filed: Dec. 19, 2005

(65) Prior Publication Data

US 2007/0120068 A1 May 31, 2007

(30) Foreign Application Priority Data

Nov. 30, 2005 (JP) .............................. 2005-344855

(51) Int. Cl.
*H01J 37/18* (2006.01)
(52) U.S. Cl. .................. 250/443.1; 250/310; 250/307; 134/1.3
(58) Field of Classification Search ...................... None
See application file for complete search history.

(56) References Cited

U.S. PATENT DOCUMENTS

| | | | |
|---|---|---|---|
| 4,789,781 A | 12/1988 | Kitagawa et al. | |
| 5,091,651 A | 2/1992 | Hokke | |
| 5,296,669 A | 3/1994 | Kobayashi et al. | |
| 5,898,177 A | 4/1999 | Hidaka et al. | |
| 5,914,493 A | 6/1999 | Morita et al. | |
| 6,025,592 A | 2/2000 | Knowles et al. | |
| 7,078,689 B1 * | 7/2006 | Adler et al. | ................. 250/306 |

FOREIGN PATENT DOCUMENTS

| | | |
|---|---|---|
| JP | 5-135752 | 6/1993 |
| JP | 9-171791 | 6/1997 |
| JP | 11-329328 | 11/1999 |

\* cited by examiner

*Primary Examiner*—Jack I. Berman
(74) *Attorney, Agent, or Firm*—Antonelli, Terry, Stout & Kraus, LLP.

(57) ABSTRACT

A sample measuring method and a charged particle beam apparatus are provided which remove contaminants, that have adhered to a sample in a sample chamber of an electron microscope, to eliminate adverse effects on the subsequent manufacturing processes. To achieve this objective, after the sample measurement or inspection is made by using a charged particle beam, contaminants on the sample are removed before the next semiconductor manufacturing process. This allows the contaminants adhering to the sample in the sample chamber to be removed and therefore failures or defects that may occur in a semiconductor fabrication process following the measurement and inspection can be minimized.

5 Claims, 8 Drawing Sheets

CHARGED PARTICLE BEAM APPARATUS

BACKGROUND OF THE INVENTION

The present invention relates to a sample measuring method and a charged particle beam apparatus and more specifically to a charged particle beam apparatus that does not contaminate the sample.

A process assessment is performed by measuring a pattern width as by a CD-SEM (Critical Dimension-Scanning Electron Microscope) after resist application, exposure and development. More specifically, to check by a scanning electron microscope represented by CD-SEM whether a pattern formed on a sample such as semiconductor wafer is properly formed, a sample is moved by a sample stage so that an electron beam can be radiated against a desired pattern.

In such an apparatus, if a contaminant is adhering to a surface of the sample, scanning an electron beam over a portion where the contaminant is present means that the electron beam scans the surface of the contaminant, making it impossible to produce a true sample image or obtain correct measurements of sample dimensions. A technique to solve this problem is disclosed in Patent Document 1.

JP-A-11-329328 proposes that, before introducing a sample into a sample chamber in an electron beam inspection apparatus, the sample is heated by a heater installed in a preliminary exhaust chamber of the electron beam inspection apparatus to remove the contaminant. It is also described in JP-A-5-135752 that, when the sample examination is not performed, an organic gas produced from grease used in the sample stage is removed by heating it to 50-60° C.

It has been found in recent years that contaminants may adhere to semiconductor wafers as they undergo measurement or inspection by a scanning electron microscope. If these contaminants adhere to a semiconductor wafer, air bubbles may be formed in a resist during a subsequent resist application process. Because of the air bubbles, the resist may be formed thin, which in turn will likely to result in another problem that pits may be formed in a base material during a dry etch process.

Investigations by the authors of this invention have found that contaminants adhering to the sample are fluorocompounds used as a lubricant in the electron microscope. The fluorocompounds can mostly be removed if subjected to a cleaning process. However, to shorten the time taken by the semiconductor manufacturing process as much as possible, it is desired that the sample be transferred directly to the resist application process following the measurement or inspection by the scanning electron microscope, without undergoing the cleaning process.

The technique disclosed in JP-A-11-329328 performs heating of the sample before introducing the sample into the sample chamber. This can temporarily remove the contaminants. However, contaminants that adhere to the sample in the sample chamber remain on the sample, giving rise to a problem that the contaminants can cause failures in the subsequent manufacturing process.

Further, as disclosed in JP-A-5-135752, it is conceivable to heat the sample chamber. Since materials that are weak to heat, such as O-ring, are used in some cases in the sample chamber, heating the sample chamber itself is not preferred. Vaporized grease may adhere to inner walls of the sample chamber, from which it may fly to the sample.

SUMMARY OF THE INVENTION

An object of this invention is to provide a sample measuring method and a charged particle beam apparatus which can remove contaminants adhering to a sample in the sample chamber of an electron microscope and suppress their adverse effects on the subsequent manufacturing process.

To achieve the above objective, an apparatus is provided which executes a sample contaminant removing process prior to the next semiconductor manufacturing process after the sample measurement or inspection by the charged particle beam has been made. Other constructions and embodiments of this invention will be described in detail in the section of preferred embodiment of the invention.

With this invention, because contaminants adhering to a sample in the sample chamber can be removed, failures that may occur in the semiconductor fabrication process following the measurement and inspection can be minimized.

Other objects, features and advantages of the invention will become apparent from the following description of the embodiments of the invention taken in conjunction with the accompanying drawings.

DETAILED DESCRIPTION OF THE INVENTION

Figure 1:
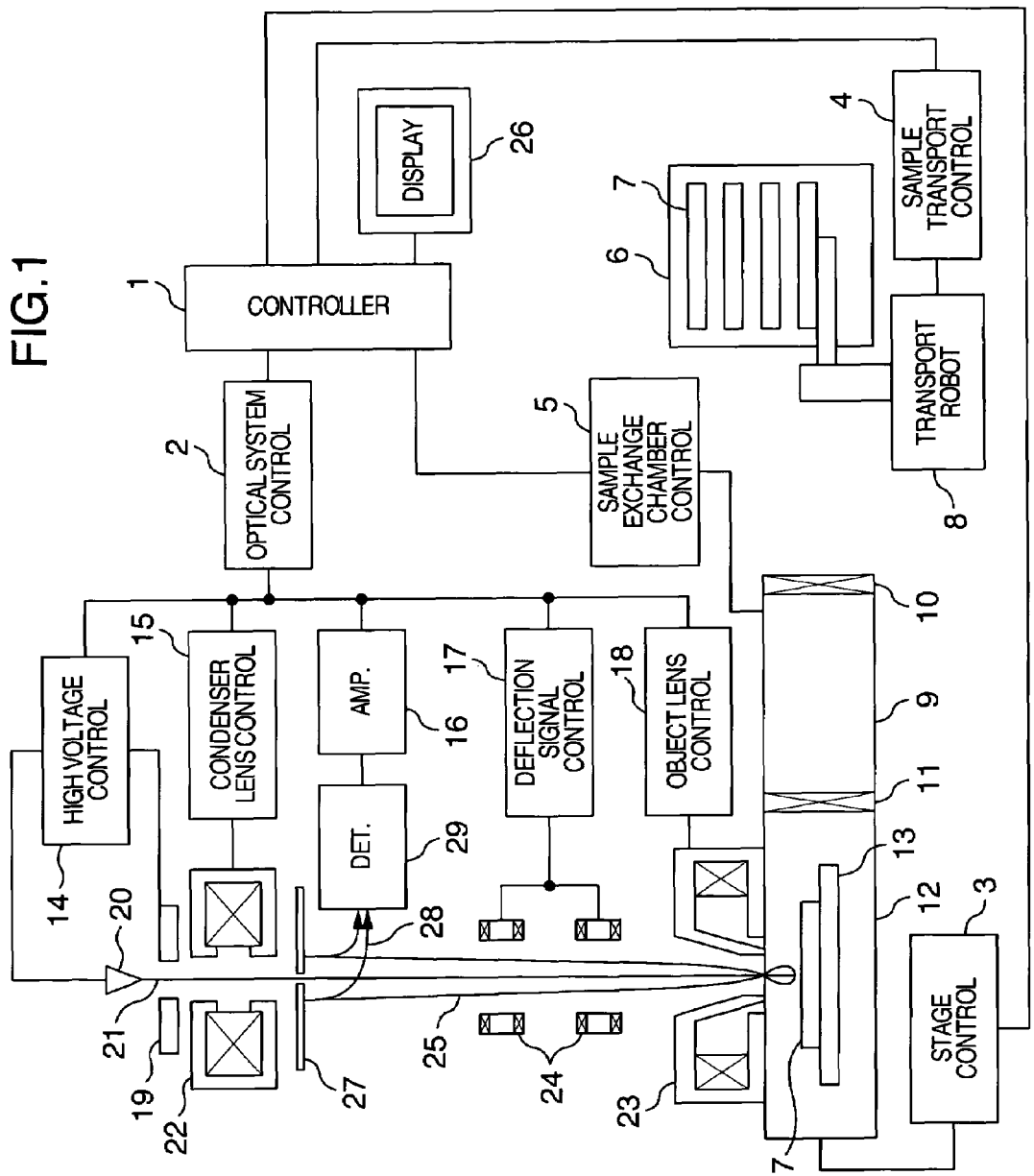
FIG. 1 is a schematic diagram showing an outline configuration of a scanning electron microscope.

FIG. 1 shows an outline configuration of a scanning electron microscope as one example of this invention. A controller 1 controls an optical system control device 2, a stage control device 3, a sample delivery control device 4, and a sample exchange chamber control device 5 according to an acceleration voltage, sample (semiconductor device) information, measurement position information and wafer cassette information entered by an operator from a user interface not shown.

Upon receiving a command from the controller 1, the sample delivery control device 4 controls a transport robot 8 to move a desired wafer 7 from a wafer cassette 6 to a desired position in the sample exchange chamber 9. In connection with the wafer 7 being carried into or out of the load-lock chamber 9, the sample exchange chamber control device 5 controls the open-close operation of gate valves 10, 11. Further, the sample exchange chamber control device 5 controls a vacuum pump (not sown) to evacuate the interior of the sample exchange chamber 9 to create the same level of vacuum as that of the sample chamber 12 in the sample exchange chamber 9 when the gate valve 11 is open. The wafer 7 introduced into the sample exchange chamber 9 is transported into the sample chamber 12 through the gate valve 11 and fixed on a stage 13.

The optical system control device 2, according to a command from the controller 1, controls a high voltage control device 14, a condenser lens control unit 15, an amplifier 16, a deflection signal control unit 17, and an object lens control unit 18.

An electron beam 21 drawn out from an electron source 20 by a drawout electrode 19 is focused by a condenser lens 22 and an object lens 23 and radiated against the wafer 7 placed on the stage 13. The electron beam 21 is scanned over the wafer 7 one- or two-dimensionally by a deflector 24 that receives a signal from the deflection signal control unit 17.

Secondary charged particles 25, released from the wafer as a result of radiation of the electron beam 21 onto the wafer 7, are transformed by a secondary electron conversion electrode 27 into secondary electrons 28, which are arrested by a secondary charged particle detector 29 and then used via an amplifier 16 as a luminance signal for a screen of a display 26.

A pattern configuration on the wafer can be reproduced on the display 26 by synchronizing a deflection signal of the display 26 with a deflection signal of the deflector 24.

EMBODIMENT 1

Figure 2:
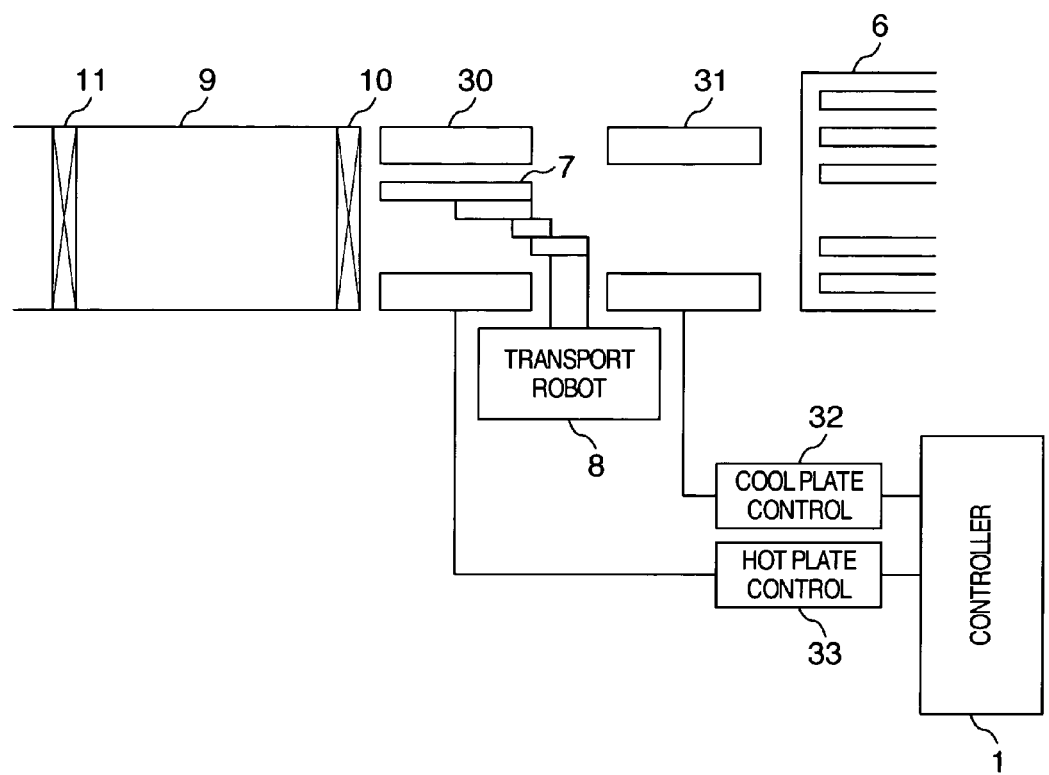
FIG. 2 shows a scanning electron microscope incorporating a sample heating device.

FIG. 2 represents an example of this invention in which a heating device for a sample (semiconductor wafer) is installed between the load-lock chamber 9 and the wafer cassette 6. In this example, a process will be described in which the wafer 7, after completing the measurement and inspection by the electron beam, passes between two heaters 30 and then through a cooling mechanism 31 before returning into the wafer cassette 6. The heaters are provided with an exhaust unit not shown. In this example, the heaters use a resistive heating type hot plate 30. Cool plates (cooling mechanism) 31 employed are of a water-cooled type.

Possible examples of replacement of the heaters include a lamp heating device and a member through which a hot medium flows.

The wafer 7, after completing the measurement, is placed on the hot plate 30 by the robot 8. The hot plate 30 is preheated to a predetermined temperature by a hot plate control device 33 and begins heating when the wafer 7 is placed on it. The hot plate 30 and the cool plate 31 are mounted with exhaust mechanisms for discharging foreign substances and hot exhaust to prevent foreign substances from adhering to the wafer surface or to prevent an outflow of heat to the outside.

When a preset time elapses from the start of heating, the robot 8 takes out the wafer 7 and puts it on the cool plate 31. The cool plate 31 is cooled to a predetermined temperature by a cool plate control device 32 and begins cooling when the wafer 7 is placed on it. When a preset time elapses from the start of cooling, the robot 8 takes out the wafer 7 and returns it to the wafer cassette 6.

Figure 3:
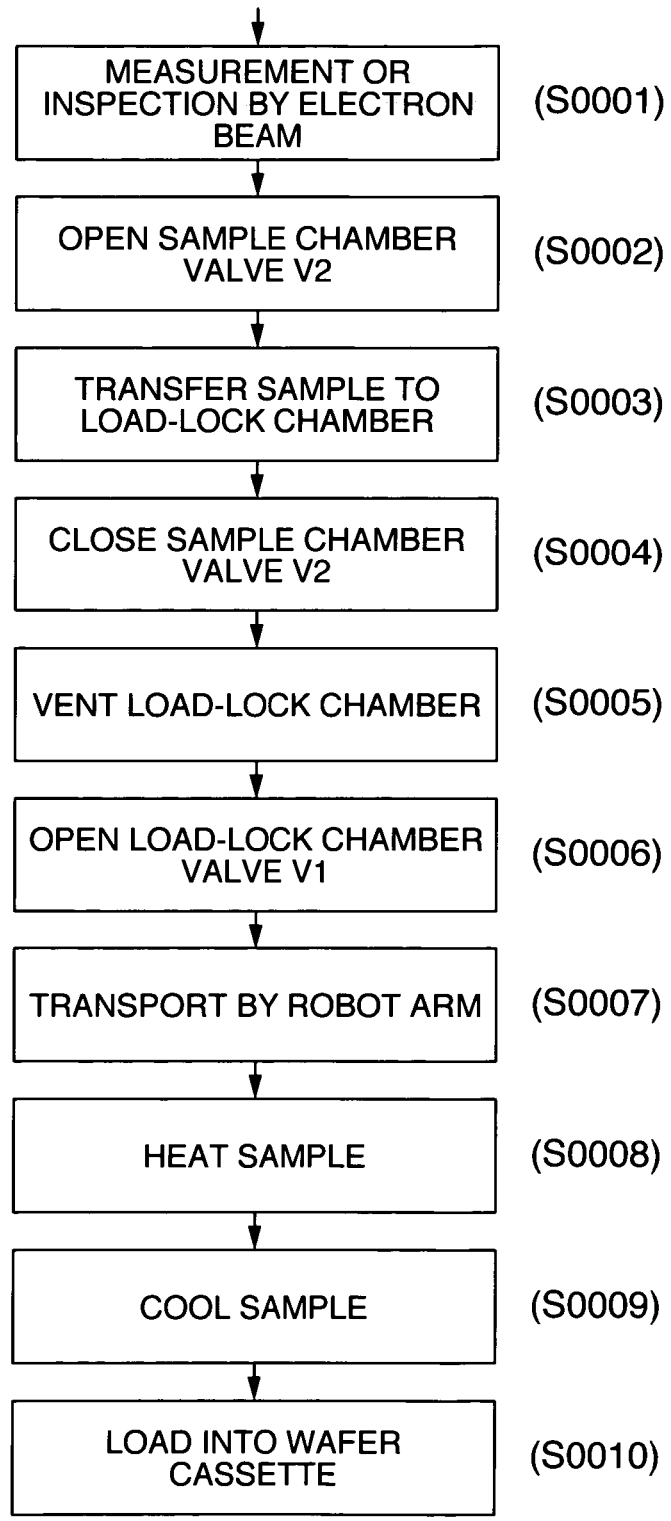
FIG. 3 is a flow chart showing a sequence of processing from a step of performing a measurement/inspection using an electron beam to a step of mounting a wafer on a wafer cassette.

FIG. 3 is a flow chart showing a sequence of processing from a step of performing a measurement/inspection using an electron beam to a step of loading a wafer 7 in a wafer cassette 6. After the gate valve 11 (V2) installed between the sample chamber 12 and the load-lock chamber 9 is open (S0002), the wafer 7 that has completed the measurement or inspection by the electron beam (S0001) is transferred into the load-lock chamber (S0003).

Next, the gate valve 11 is closed (S0004) and the interior of the load-lock chamber is leaked to the atmosphere (S0005). The load-lock chamber 9 is provided with a leakage pipe not shown which has mounted therein a leak valve and a leak device. The leak valve is opened to leak the load lock chamber 9.

Next, the gate valve 10 (V1) installed between the load-lock chamber 9 open to the atmosphere and the wafer cassette 6 is opened (S0006), and the wafer 7 is taken out of the load-lock chamber 9 by the transport robot 8 (S0007). In this example, after the ambience of the wafer 7 is open to the atmosphere, the wafer 7 is heated by the heater 30 (S0008). This is done for the following reason.

A sliding portion of the sample stage 13 (a portion through which two members contact each other as they move relative to each other) is applied with a lubricant. As one example of lubricant, there is fluorinated lubricant. Fluorinated lubricant, particularly one combined with carbon, is chemically stable and inert and therefore can suitably be used as a lubricant for the stage of scanning electron microscope.

Such a fluorinated lubricant, while it has an excellent characteristic for enhancing the lubricating performance, is found to have a problem that its low-molecular weight component adheres to the wafer. A lubricant (oil) that is refined to enhance the lubricating performance has a predetermined molecular weight distribution. When a part of the low-molecular weight component separates from the oil surface, it may fly in many random directions and strike and bounce off the inner wall of the sample chamber because the chamber is vacuum. Further, it is also conceivable that the low-molecular weight component adhering to the inner wall of the sample chamber may come off and fly again.

A part of the low-molecular weight component flying in the sample chamber is discharged by the evacuation of the chamber. However, the inventors of this invention has found that a part of the flying low-molecular weight component repeats adhesion and separation before eventually sticking to the wafer.

A further investigation by the inventors shows that the low-molecular weight component adhering to the wafer may produce air bubbles in a resist during a subsequent resist application process. Because of the air bubbles the resist is formed thin, giving rise to a possibility of pits being formed in a base material during a subsequent dry etching process.

To reduce time and cost of the semiconductor process a semiconductor wafer cleaning process has come to be eliminated in recent years. Thus, a possibility arises that the low-molecular weight component may move into the resist application process while adhering to the semiconductor wafer. This further increases a possibility of failure.

As described above, in a vacuum chamber in which the sliding member is installed and the low-molecular weight components can fly, the low-molecular weight components may adhere to the wafer 7 again. For this reason, this embodiment heats the semiconductor wafer to remove the low-molecular weight components only after the wafer has been transferred to a space of atmospheric pressure.

It is possible to start heating the wafer with the load-lock chamber evacuated and then to open the load-lock chamber to the atmosphere with the wafer kept at a predetermined temperature. Under a circumstance where the low-molecular weight components occur only in the sample chamber but not in the load-lock chamber (for example, a moving member applied with a lubricant is not present in the load-lock chamber), a heating process may be executed before the load-lock chamber is open to the atmosphere.

In this example, the wafer heating temperature is set to 200° C. and the heating time to 60 seconds. A result of test conducted by the inventors has found that the low-molecular weight components adhering to the wafer surface mostly remain attached to the surface at the heating temperature of less than 100° C., that at the heating temperature more than 100° C. they begin to be eliminated gradually, and that at 200° C. almost all low-molecular weight components can be removed. (At the heating temperature of more than 200° C., although the heating time is slightly reduced, the cooling time may become longer making the overall baking time longer.)

The heating temperature and time of the hot plate 30 are controlled by the heater control device 33, and the wafer 7 can be heated to the above heating temperature for the duration described above. The controller 1 is provided with an input device, not shown, for an operator to set a desired heating time and heating temperature.

Next, the wafer 7 removed of the low-molecular weight component by heating is cooled by the cooling mechanism 31 (S0009). The cooling mechanism 31 is controlled by the cooling mechanism control device 32 to cool the wafer 7 to a desired temperature for a desired time.

The cooling system employed in this embodiment is a water cooling type which cools the wafer by circulating pure water cooled to a preset temperature.

Considering the heat resistance of the wafer cassette and the effect of heat on other wafers in the cassette, the wafer is preferably cooled to less than 50° C. (as close to room temperature as possible).

Although the wafer may be naturally cooled, since this will cause a delay in the semiconductor fabrication process, it is desired that a cooling means be used to positively cool the wafer. Further, the transport robot 8 is often installed in a space called a minienvironment in which a highly clean environment is maintained. The minienvironment is an enclosure which keeps its inner pressure high to prevent dust and particles from entering from outside. It has a fan to introduce air from outside through a filter to increase the inner pressure. This air flow may be used for cooling. It is also possible to provide a mechanism for introducing cool air instead of a fan that generates a down flow in the minienvironment.

After being heated and cooled as described above, the wafer 7 is returned to its original loaded position in the wafer cassette 6 (S0010).

With the above processing complete, the wafer removed of the low-molecular weight component can now be transferred to the next semiconductor fabrication process.

It is also conceivable to remove the low-molecular weight component using other devices after the measurement/inspection by the electron microscope is made. However, considering an additional step of taking out the wafer, that was returned to the wafer cassette, only for the removal of low-molecular weight component, or a step of moving the wafer cassette to other low-molecular weight component removing device, it is desired in terms of efficiency that the low-molecular weight component removal processing be executed before the wafer is loaded into the wafer cassette.

An example case has been described in which the wafer heating mechanism is installed on a wafer moving path between the load-lock chamber and the wafer cassette. It is possible to provide a sidetrack for wafer where the heater and the cooling mechanism may be installed.

EMBODIMENT 2

Figure 4:
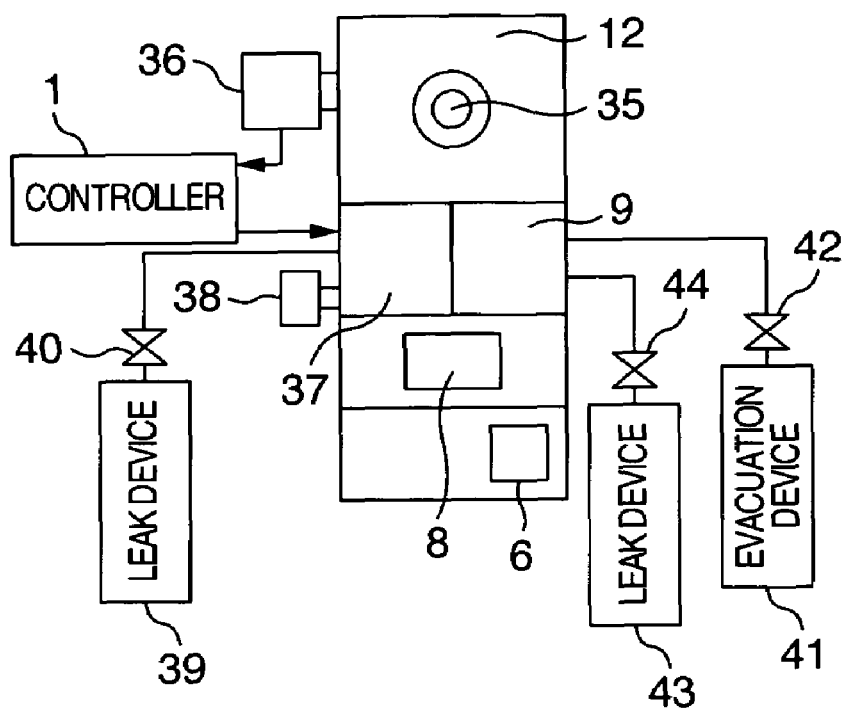
FIG. 4 illustrates a configuration of an electron microscope incorporating a device for measuring contaminants in the sample chamber.

FIG. 4 is a plan view of a scanning electron microscope in which a measuring device 36 for measuring a contaminant in the sample chamber 12 is mounted on the sample chamber having a microscope cylinder 35 installed therein.

The measuring device 36 is controlled by the controller 1. A result of measurement is sent to the controller 1 which, based on the result of measurement, controls a heating unit 37. The heating unit 37 is mounted with a heat exhaust unit 38 to release inner heat, a nitrogen leak device 39 to release the vacuum in the heating unit 37, and a leak valve 40 that is opened to vent nitrogen into the heating unit 37.

The load-lock chamber 9 is mounted with an evacuation device 41 to evacuate the load-lock chamber 9 and an exhaust valve 42, and with a leak device 43 to release the vacuum in the load-lock chamber 9 and a leak valve 44.

Figure 5:
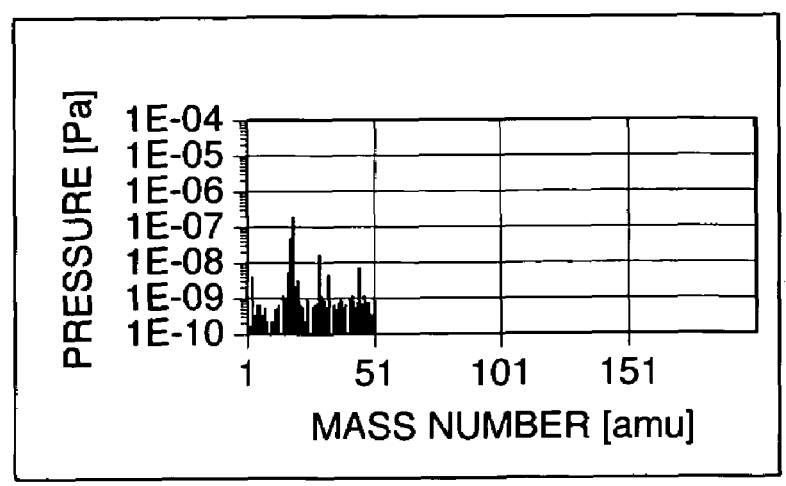
FIG. 5 is a graph representing a case where low-molecular weight compounds are not detected in the sample chamber.

The measuring device 36 is, for example, a quadrupole mass spectrometer which can identify a substance present in the sample chamber 12. Results of measurement made by the quadrupole mass spectrometer will be explained by referring to FIG. 5 and FIG. 6. FIG. 5 represents a case in which the quadrupole mass spectrometer did not detect any low-molecular weight component, and FIG. 6 represents a case in which a low-molecular weight components was detected.

Figure 6:
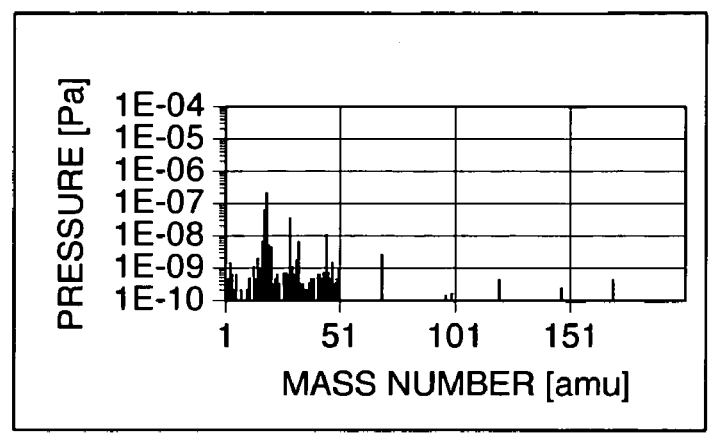
FIG. 6 is a graph representing a case where low-molecular weight compound are detected in the sample chamber.

While in FIG. 5 no substances with mass number of more than 51 were detected, FIG. 6 shows that substances with mass number of 69, 119 and 169 were detected. These substances correspond in chemical expression to $CF_3$, $C_2F_5$ and $C_3F_7$ respectively, indicating that fluorinated substances are volatilized in the vacuum.

If a result of measurement such as shown in FIG. 5 is obtained, it can be decided that no contaminant is attached to the semiconductor wafer surface. So, the wafer is transported by the transport robot 8 from the load-lock chamber 9 to the wafer cassette 6 without passing it through the heating unit 37.

When on the other hand a result of measurement such as shown in FIG. 6 is obtained, it is considered that contaminants including fluorinated lubricant, e.g., perfluoropolyether (PFPE), and compounds of fluorine and carbon, constituents of PFPE, are adhering to the wafer surface. So, the wafer is transported to the heating unit 37 where it is heated and removed of contaminants, before being carried by the transport robot 8 to the wafer cassette 6.

As described above, according to the atmosphere in the sample chamber 12, a decision is made as to whether contaminants are adhering to the wafer. Depending on this decision, whether the heating process is required or not is determined, eliminating the execution of unnecessary heating process and allowing for both the removal of contaminants from the wafer and an improved efficiency of electron microscope measurement.

Although the above example makes a decision as to whether the heating process needs to be executed, it is also possible to control the heating time and temperature according to the measurement result. Further, the heat resistance of a sample to be measured or inspected by the electron microscope may be taken into consideration in controlling the heating time and temperature. If the contaminant is detected to exceed a predetermined amount, the contaminant may be difficult to remove by the heating process. So, an error signal may be produced by the controller 1.

Further, it is also possible to perform a control that involves selectively heating the wafer when the amount of contaminant detected is in excess of a predetermined value and not performing the heating when the amount of contaminant is less than the predetermined value.

EMBODIMENT 3

In the preceding embodiments, the contaminants are removed from a semiconductor wafer, a sample being transported, by heating the wafer itself. In the following an example method will be explained which heats a wall surface of a vacuum chamber such as sample chamber to prevent contaminants coming off the wall of the vacuum chamber from adhering to the sample.

Figure 7:
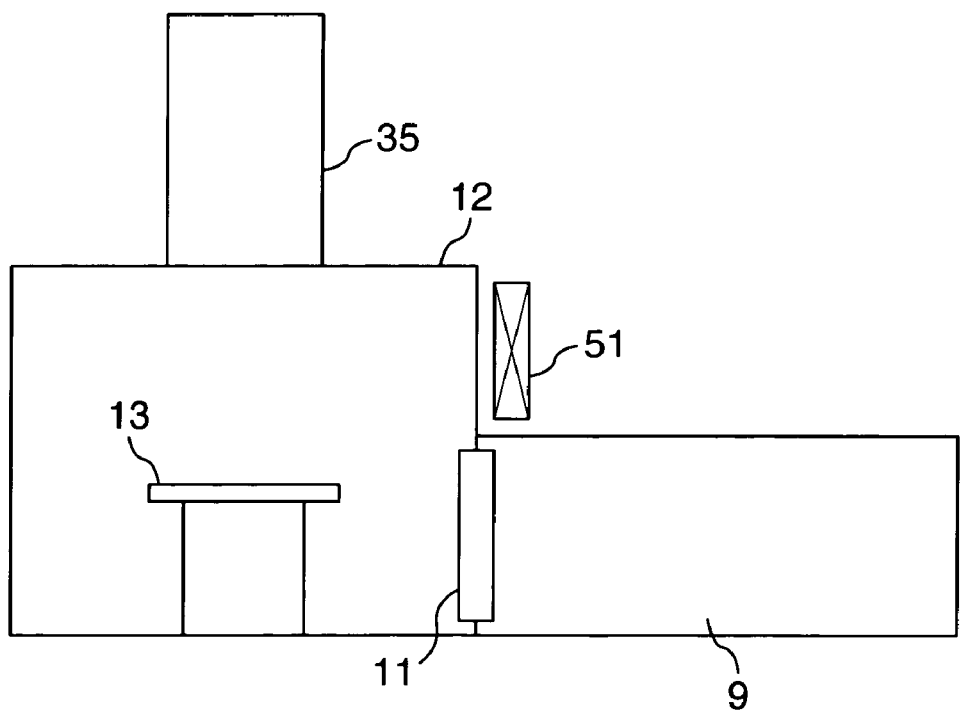
FIG. 7 illustrates a configuration of an electron microscope incorporating a heating/cooling mechanism capable of heating inner walls of the sample chamber.

FIG. 7 shows an example construction of an electron microscope incorporating a heating/cooling mechanism 51 capable of heating the inner wall of the sample chamber 12 to remove contaminants adhering to the inner wall. This heating/cooling mechanism 51 heats the inner wall of the sample chamber 12 and then cools it to remove substances produced from the sliding member used in the sample stage 13.

It is noted, however, that since it directly heats the inner wall of the sample chamber, components of the lubricant that are evaporated during heating may contaminate the inner wall of the sample chamber. To prevent this, it is desirable to install a mechanism that cools the sample stage while the sample chamber 12 is heated. This construction can selectively heat the inner wall of the sample chamber to remove contaminants without giving the lubricant an adverse effect of heating.

Although the heating/cooling mechanism 51 in this example is constructed as a combination of a member for flowing a heat medium and a Peltier device cooling mechanism, other forms of heating/cooling mechanism may be used. For example, a combination of lamp heating or resistive heating and a Peltier device cooling mechanism, or other combinations may be used.

In an electronic microscope in which the wafer 7 is carried on the sample holder (not shown) as it is transferred between the load-lock chamber 9 and the sample chamber 12, the sample holder, when it is situated in the sample chamber, can be heated along with the sample chamber 12 to prevent contaminants from diffusing out of the sample chamber.

Figure 8:
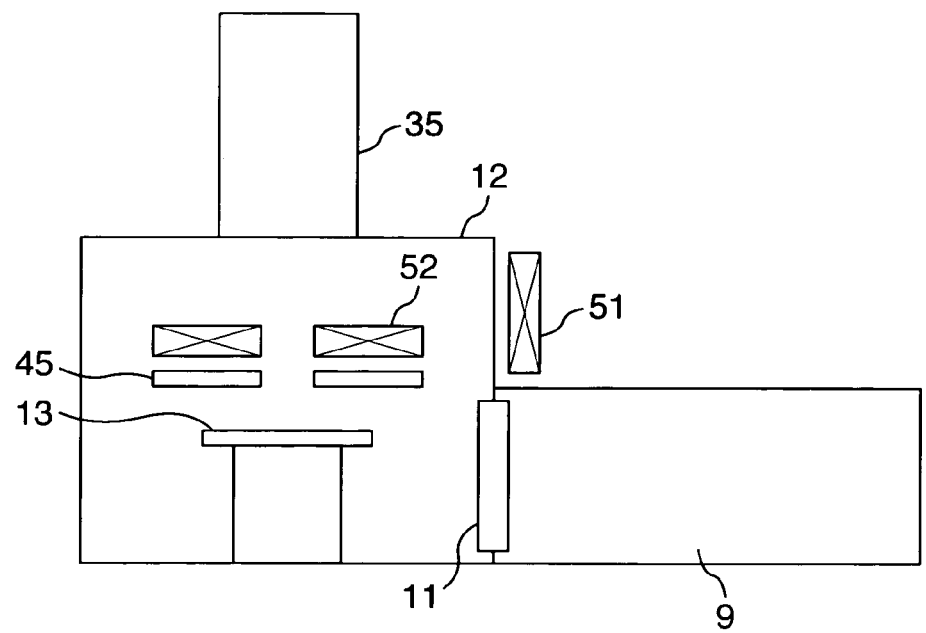
FIG. 8 illustrates a configuration of an electron microscope incorporating a voltage control electrode to control a voltage in a space in which a sample is installed.

FIG. 8 illustrates an example construction of an electronic microscope incorporating a voltage control electrode 45 to control a voltage in a space in which a sample is placed. There is a retarding technique which suppresses aberration by radiating an electron beam of low acceleration energy against a semiconductor wafer which is fragile to an electron beam of high acceleration energy. The retarding technique is a method which enhances the acceleration energy of the electron beam as it passes through an object lens by applying a negative voltage to the sample and at the same time lowering the acceleration energy of the electron beam as it reaches the sample. An electrode that can properly apply such a retarding voltage to the sample even when the sample is covered with an insulating film, is the voltage control electrode 45. Details of the voltage control electrode 45 are described in, for example, JP-A-9-171791.

The voltage control electrode 45 is arranged in a direction perpendicular to an optical axis of the electron beam to cover a range in which the sample is moved by the sample stage. If contaminants adhere to this voltage control electrode 45, since it faces the sample, the contaminants may diffuse over a wide range of sample surface by the dispersion of the contaminants and their separation from the electrode.

To solve this problem, a heating/cooling mechanism 52 to heat and cool the voltage control electrode 45 is installed in the sample chamber. In this example, since a voltage control electrode, one of the portions that can exert an evil influence on the microscope performance when adhered to by contaminants, can be selectively heated, measurement or inspection can be made without contaminating the sample.

Figure 9:
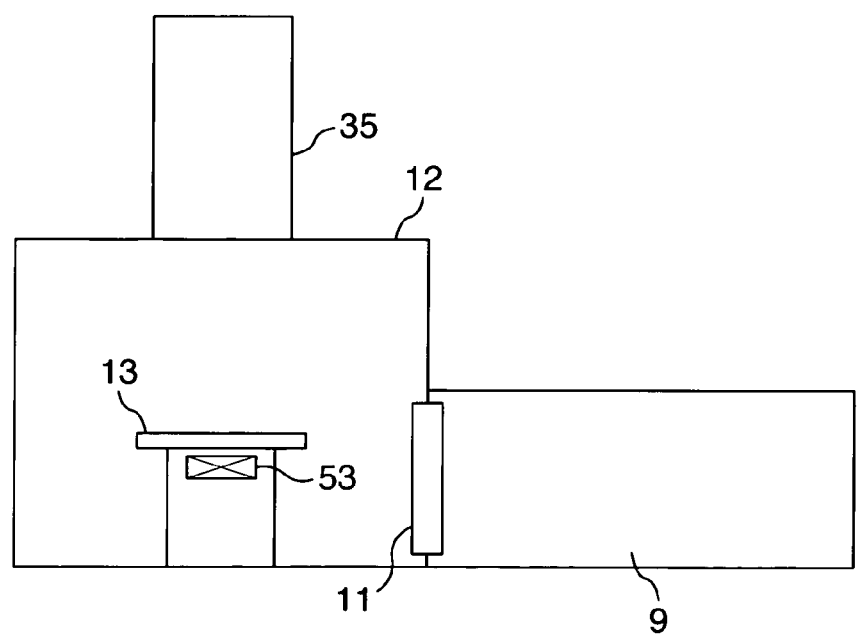
FIG. 9 illustrates a configuration of an electron microscope incorporating a heating/cooling mechanism capable of directly heating the sample stage.

FIG. 9 shows an example construction of a microscope incorporating a heating/cooling mechanism 53 to directly heat the stage 13. In the sample chamber 12 it is possible that contaminants are moving around. Therefore, after measurement or inspection by the electronic microscope is completed, the sample or the sample holder carrying it is heated as the sample is moved out of the sample chamber 12 before the gate valve 11 is opened. This makes it possible to clean the sample without diffusing contaminants out of the sample chamber.

EMBODIMENT 4

Example methods and constructions for removing contaminants following measurement and inspection have been described. An example apparatus capable of suppressing adhesion of contaminants to the inner wall of the load-lock chamber will be explained as follows.

The load-lock chamber 9 is a space to preliminarily exhaust the sample ambience when introducing the sample into the sample chamber 12. Among apparatus that continuously perform measurement and inspection on wafers, there is one that has a plurality of load-lock chambers so that as soon as the measurement of one wafer is finished, the next wafer is introduced into the sample chamber.

Figure 10:
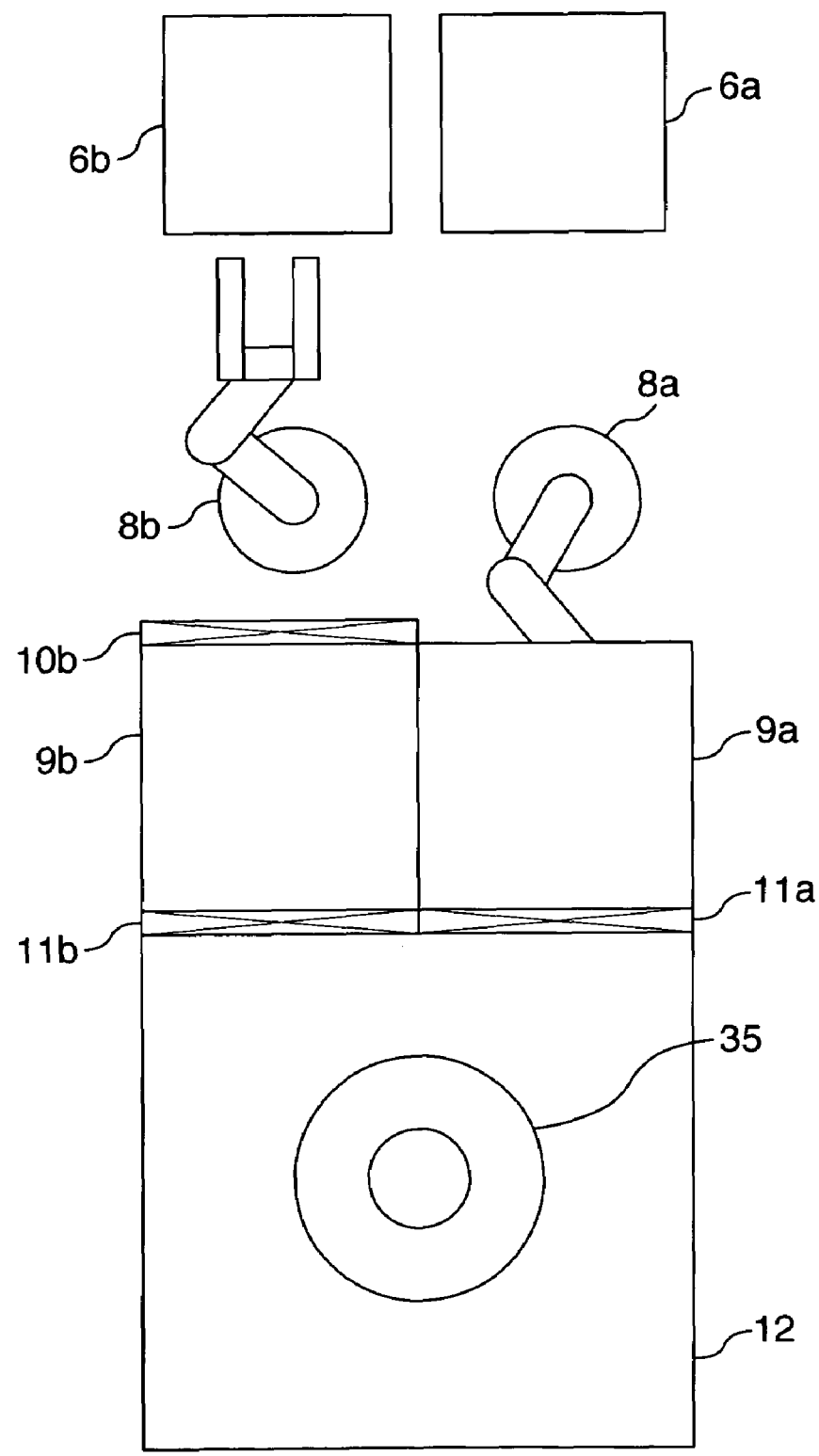
FIG. 10 is a plan view of a charged particle beam apparatus and a load-lock chamber.

FIG. 10 is a plan view of a charged particle beam apparatus and a load-lock chamber. Here, a charged particle beam apparatus capable of having two wafer cassettes 6 is taken as an example. In this example, wafers are carried by robot arms 8a, 8b from the wafer cassettes 6a, 6b into load-lock chambers 9a, 9b. The wafers transferred into the load-lock chambers 9a, 9b are then introduced alternately into the sample chamber 12 where they are subjected to measurement and inspection using an electron beam. Having undergone the measurement and inspection, the wafers are moved back into the wafer cassette 6 through the same path as when they were transferred into the sample chamber 12.

In this process, to enhance throughput, the wafer must be kept standing by in the load-lock chamber maintained at vacuum so that as soon as the preceding measurement is finished, the wafer can be introduced.

However, keeping the wafer standing by for a long period of time in the vacuum chamber may cause a problem of wafer contamination in the vacuum chamber as explained earlier.

In light of this problem, the construction of this example has the wafer stand by in the load-lock chamber maintained at the atmospheric pressure except for the evacuation time.

Figure 11:
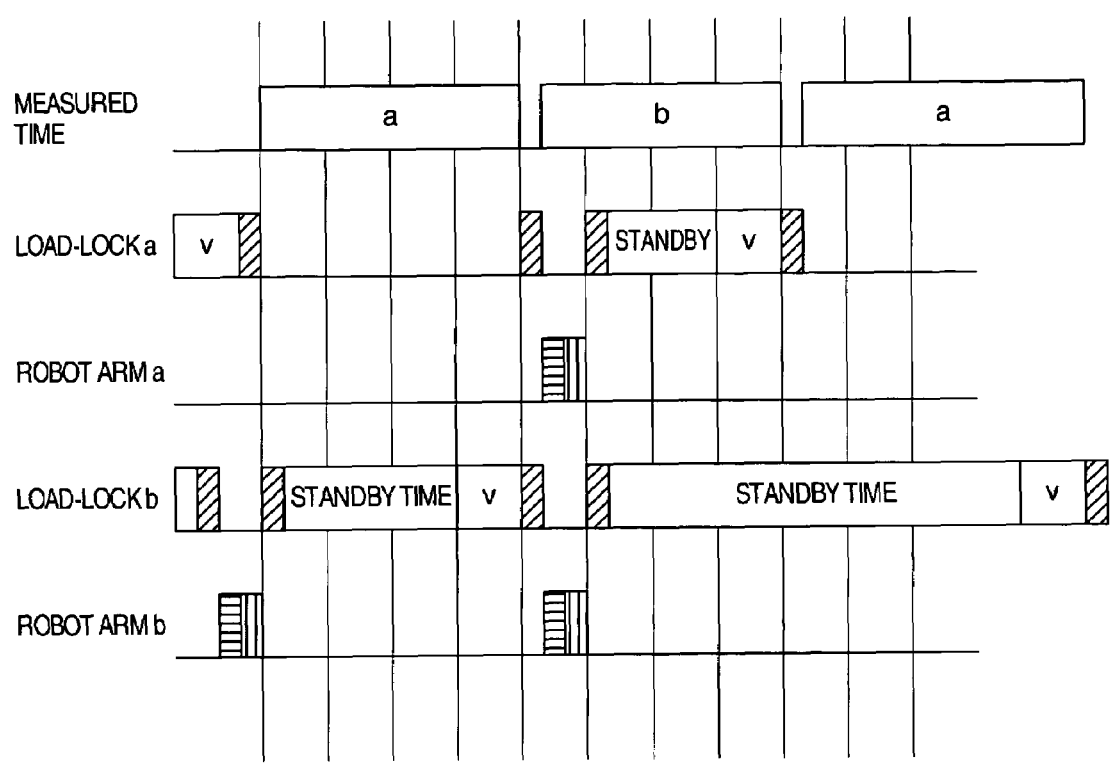
FIG. 11 is a diagram of a sequence for holding a wafer in a standby state, with an interior of the load-lock chamber maintained at the atmospheric pressure.

FIG. 11 shows a sequence of operation when a wafer is kept standing by with the load-lock chamber maintained at the atmospheric pressure. "Load-lock a" explains an evacuation time of the load-lock chamber 9a (denoted v), the wafer transfer to and from the sample chamber 12, and open-close operation times (shown shaded) of gate valves 11a, 11b (not shown) provided in the load-lock chamber 9a. A wafer is carried between the sample chamber 12 and the load-lock chamber 9 by a moving mechanism not shown.

"Robot arm a" explains a time taken by the robot arm 8a to transfer the wafer between the wafer cassette 6a and the load-lock chamber 9a (transfer from load-lock chamber 9a to wafer cassette 6a is represented by a horizontal line and transfer from wafer cassette 6a to load-lock chamber 9a is represented by a vertical line).

"Load-lock b" and "robot arm b" similarly represent times spent in the wafer cassette 6b, load-lock chamber 9b, gate valves 10b, 11b and sample chamber 12.

As explained earlier, a risk of wafer contamination is higher in a vacuum state than in the atmospheric pressure. It is therefore desirable to make the time that the wafer is placed in the vacuum chamber as small as possible. Considering these conditions, the wafer in this example is made to stand by in the load-lock chamber at the atmospheric pressure except for the evacuation time.

More specifically, as explained in FIG. 11, during the time which elapses after the wafer has been introduced into the load-lock chamber 9a by the robot arm 8a until it is introduced into the sample chamber 12, a standby time for the wafer to stand by at the atmospheric pressure is provided, excluding the evacuation time "v" to a specified vacuum level and the wafer transfer time.

To execute this processing, the time required by the action associated with the wafer transfer and the time it takes for the load-lock chamber to reach a predetermined level of vacuum are subtracted from a planned measurement end time of another load-lock chamber to calculate a remaining time. This remaining time is made a "standby time". After the wafer has been introduced to the load-lock chamber, the standby time can be determined by subtracting the time it takes for the load-lock chamber to reach a predetermined vacuum level from the planned end time of the previous measurement.

With the above construction, it is possible to eliminate the contamination risk caused by putting the sample in a vacuum state and also improve throughput by introducing the wafer into the sample chamber immediately after the end of the preceding measurement.

From the standpoint of simplifying the sequence, it is preferred to have the wafer stand by in a vacuum state and introduce the next wafer after the end of the preceding measurement is detected. However, this example focuses on the problem of wafer contamination and provides a standby time for reducing the evacuation time, thereby suppressing the wafer contamination without degrading the throughput.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus comprising:
   a charged particle source;
   a sample stage a sample on which to put a sample to be radiated with a charged particle beam emitted from the charged particle source;
   a vacuum chamber to evacuate a space surrounding the sample to a vacuum; and
   a controller to control a heating device for heating the sample;
   wherein the controller controls the heating device so that the heating device heats the sample when or after the space surrounding the sample is opened to the atmosphere after the sample has been radiated with the charged particle beam.

2. A charged particle beam apparatus according to claim 1, wherein the controller controls the heating device to heat the sample to a temperature higher than 100° C. and lower than 200° C.

3. A charged particle beam apparatus according to claim 2, wherein the controller controls the heating device to heat the sample during a time in which fluorocarbon compounds adhering to the sample can be removed.

4. A charged particle beam apparatus according to claim 1, wherein a measuring device is installed in the vacuum chamber to measure contaminants in the vacuum chamber and, when the contaminants are detected or more than a predetermined amount of the contaminants is detected by the measuring device, the sample is heated.

5. A charged particle beam apparatus according to claim 4, wherein the contaminants are fluorocompounds.

* * * * *